United States Patent [19]

Dugan et al.

[11] Patent Number: 5,017,880
[45] Date of Patent: May 21, 1991

[54] VARYING OPERATIONAL FREQUENCY CONTROL CIRCUIT APPARATUS WITH NOISE MINIMIZING FEATURE

[75] Inventors: John M. Dugan, Richardson, Tex.; Gordon W. Ries, Plano, Tex.

[73] Assignees: Rockwell International Corporation, El Segundo, Calif.; Rockwell International Corporation, El Segundo, Calif.

[21] Appl. No.: 469,647

[22] Filed: Jan. 24, 1990

[51] Int. Cl.$^5$ .............................................. H01S 3/10
[52] U.S. Cl. .................................. 328/165; 307/520; 372/26
[58] Field of Search .......................... 328/165; 372/26; 307/520

[56] References Cited

U.S. PATENT DOCUMENTS

| | | | |
|---|---|---|---|
| 4,181,892 | 1/1980 | Dilley | 328/165 |
| 4,328,591 | 5/1982 | Baghdady | 328/165 |
| 4,682,045 | 7/1987 | Amazawa et al. | 328/165 |
| 4,868,836 | 9/1989 | Howard | 372/26 |
| 4,916,705 | 4/1990 | Glance | 372/26 |
| 4,924,470 | 5/1990 | Ries | 372/26 |

Primary Examiner—John S. Heyman
Attorney, Agent, or Firm—Bruce C. Lutz; V. Lawrence Sewell; H. Fredrick Hamann

[57] ABSTRACT

Many prior control circuits inject a small amplitude control tone into the prime signal path where the distortion added to the prime or main signal by the control tone does not present a significant corruption of the prime signal. This control tone is detected and, based on the detected parameters, the prime signal is adjusted as to one of its parameters such as amplitude. If there are variable frequency spurious signals that may produce products within the bandwidth of the control system, the operation of the control circuit can be completely disrupted. The present invention overcomes the prior art problem by continuously sweeping the frequency of the control tone whereby the detection of the spurious signals in the operation of the control circuit occurs such a small percentage of the time that the control circuit can maintain reliable control operation.

5 Claims, 3 Drawing Sheets

VARYING OPERATIONAL FREQUENCY CONTROL CIRCUIT APPARATUS WITH NOISE MINIMIZING FEATURE

THE INVENTION

The present invention is generally related to electronics and more specifically related to control circuits. Even more specifically, the present invention is related to a method of overcoming problems generated by spurious signals of varying frequencies which may be detected by and which interfere with the reliable operation of a control circuit.

BACKGROUND

In the control of systems which contain a non-linear element in a controlled primary signal path, it is sometimes necessary to inject one or more control tones to sense a feature of the non-linearity. For instance, a single tone can be used to describe the first derivative of the non-linearity and two tones through their intermodulation product can be used to describe the second derivative of the non-linearity.

The amplitude of the control tones used must be limited to a small percentage, typically less than 5%, of the amplitude of the primary signal passing through the control system or significant corruption of the primary signal will result. Further, the control tones must be spectrally isolated from the primary signal so that the control tones and their intermodulation products can be recovered for analysis or use in the control process.

An example of such a system may be found in U.S. Pat. No. 4,924,470, issued 8 May, 1990, and assigned to the same assignee as the present invention. This control system which was developed by one of the present co-inventors operates satisfactorily for the environment for which it was initially designed to operate.

In attempting to use the concept presented in the referenced application where some of the functions such as the NRZ-to-RZ function of block 10 are implemented on a gallium arsenide substrate, it was found that spurious oscillations originating within gallium arsenide integrated circuits would sometimes interfere with the operation of the control system. The spurious oscillations within a gallium arsenide integrated circuit vary in frequency depending upon various parameters such as temperature of the gallium arsenide circuit. Thus, it is substantially impossible to design filters into the circuit to eliminate the effect of the spurious oscillations.

When the presence of the interfering tone or spurious oscillation is close enough to the frequency of a control tone intermodulation product used in the control system to cause a beat note which is in the bandwidth of the control system, erratic behavior results in the system. To minimize the effect of the interfering tone or spurious oscillation, the present invention sweeps the frequency of the control tones so that the beat note developed between the intermodulation product and the spurious oscillation appears within the bandwidth of the control loop for only a small portion of the total sweep time. A preferred embodiment of the invention had a one Hz control loop bandwidth and the frequency of the control tone was swept over a range of ten Hz. Thus, the spurious oscillation interfered in the control system no more than 10% of the total time of operation. A well-designed signal detection portion of a control system will not be adversely affected when there are spurious interfering signals for only a small portion of time of its operation such as presented by the concept herein.

It is therefore an object of the present invention to provide an improved control system which is substantially imprevious to spurious interfering signals.

Other objects and advantages of the present invention will be apparent from a reading of the specification and the appended claims in conjunction with the drawings, wherein:

DETAILED DESCRIPTION

Figure 1:
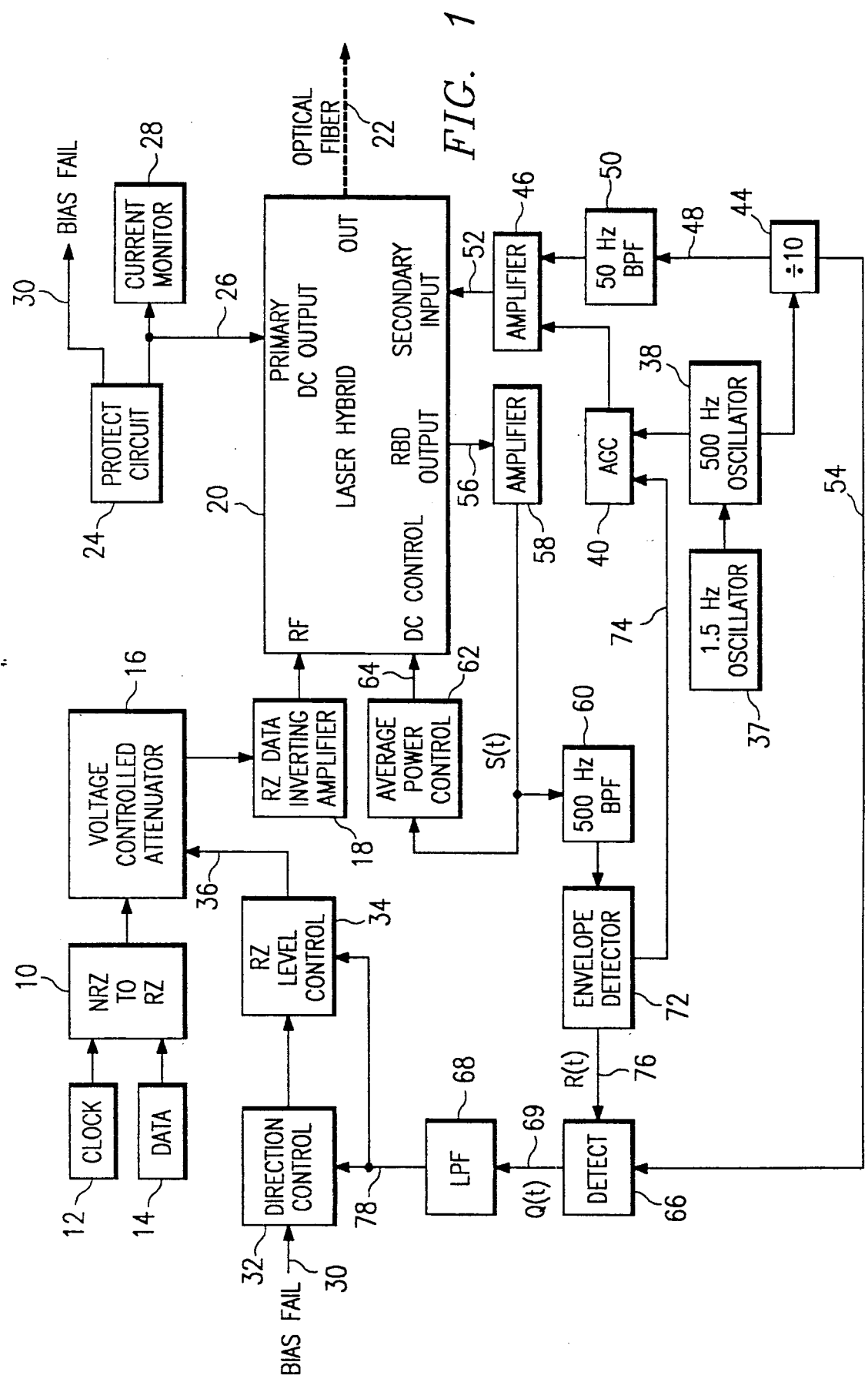
FIG. 1 is a block diagram of a controlled circuit using the present inventive concept.

In FIG. 1, a non-return-to-zero to return-to-zero (NRZ to RZ) converter 10 receives inputs of clock and data from blocks 12 and 14, respectively. The NRZ-to-RZ converter 10 supplies signals to a voltage controlled attenuator 16 which is used to control the amplitude of the RZ data signal as received from 10. Block 16 supplies the attenuated signal to a return-to-zero data inverting amplifier 18 which in turn supplies the signal to a laser hybrid block 20 comprising a non-linear element or laser diode. The output of hybrid 20 is supplied as a light beam on an optical fiber 22. The laser hybrid 20 receives an input from a protect circuit 24 on a lead 26. The signal on lead 26 is also supplied to a current monitor 28. A further bias fail output of the protect circuit 24 is supplied on a lead 30 to a direction control block 32. The direction control block 32 supplies signals to a return-to-zero level control block 34 which returns the control signal to attenuator 16 on a lead 36. A 1.5 Hz oscillator 37 supplies signals to a 500 Hz oscillator 38 which in turn supplies signals through an AGC block 40 to an amplifier 46. An output of oscillator 38 is also supplied to a divide-by-10 circuit 44 which has a first output on a lead 48 to a 50 Hz bandpass filter 50 which supplies a second input to amplifier 46. The amplifier 46 provides control tone signals to a secondary input of hybrid 20 on a lead 52. A further output of the divide-by-10 circuit 44 provides signals on a lead 54 to a detect circuit 66. The signals on leads 54 and 48, for the purposes of this invention, are identical. A rear beam detector (RBD) output of the laser hybrid is supplied on a lead 56 to an amplifier 58. Amplifier 58 supplies S(t) signals to a 500 Hz bandpass filter 60 as well as to an average power control circuit 62. An output of the average power control circuit 62 is supplied on a lead 64 to a DC control input of laser hybrid 20 to control the average power or the bias point of the laser within hybrid 20. An output of the bandpass filter 60 is supplied to an envelope detector 72 whose output appears on lead 76 and is applied to detector 66. The lead 76 contains the signals R(t) and are indicative of the envelope detected signals found on the output of amplifier 58. An output of detector 66 is supplied to a low-pass filter 68 on a lead 69 and the signals on lead 69 are additionally represented as Q(t). An output of low-pass filter 68 is supplied on a lead 78 to the direction control block 32 as well as to the return-to-zero level control block 34.

Figure 2:
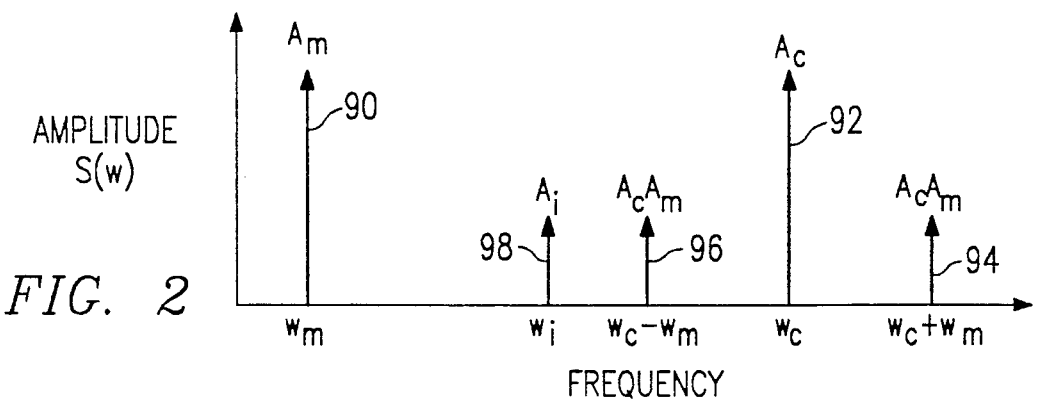
FIGS. 2 through 4 are frequency spectralgraphs used in describing the operation of FIG. 1 prior to the present inventive modification.

In the graph of FIG. 2, the Y or vertical scale is indicative of amplitude of signals while the X or horizontal axis is indicative of the frequency of a signal. A first signal 90 is indicative of the amplitude of a modulating signal such as found at the output of bandpass filter 50. A second signal 92 is indicative of the signal output by oscillator 38 and may be termed as a carrier signal. The interaction of these two signals 90 and 92 provide sum and difference signals designated as 94 and 96, respectively. As will be noted, the sum and difference signals are much lower in amplitude than the initial signals. An interfering tone signal is designated as 98 and further labeled as amplitude Ai for interference with the frequency being designated as Wi. The signals of FIG. 2 may be found at the output of amplifier 58.

Figure 3:
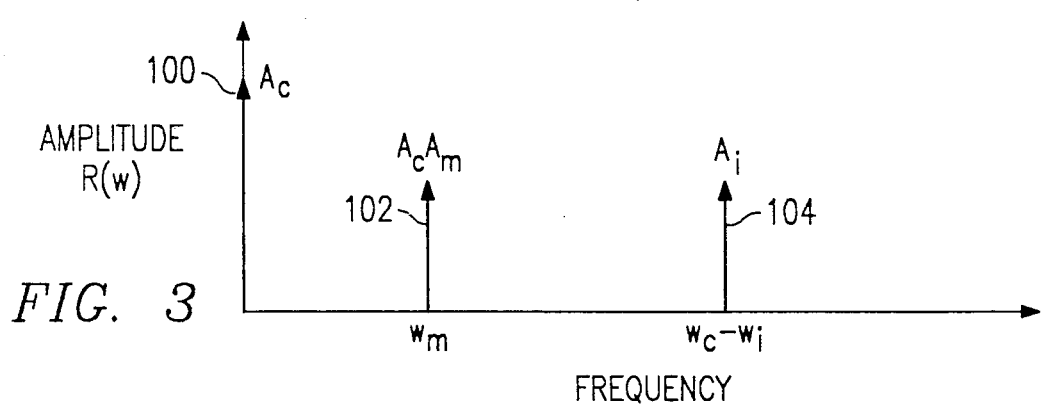

FIG. 3 illustrates the signals found on lead 76 after the signals of FIG. 2 are envelope detected. First a dc signal such as designated by $A_c$ and the alternative designator of 100 will appear indicating the amplitude of the primarily detected signal. In addition to that, there is a signal 102 which, in the examples shown, would be a signal 50 Hz above dc. The signal 102 would be comparable in amplitude to the sum of signals 94 and 96 in FIG. 2. In addition, there is a signal 104 which is representative of the interaction between signals 98 and 92 of FIG. 2. In one embodiment of the invention, the interfering tone 98 was found to vary over a wide range of frequencies from 0.01 Hz up to 3 KHZ. For the purposes of explaining the invention, it will be assumed that the frequency of signal 98 is at 410 Hz. Thus, the signal 104 would be at 90 Hz. After synchronous detection by block 66, the signals of FIG. 4 appear at the output lead 69 of detector 66. Here the signal $A_cM_c$ and alternatively labeled as signal 106 is representative of the intermodulation product of the original carrier and modulating signals 92 and 90, respectively. In addition, there is a signal 108 which is representative of the carrier, the interfering tone and the modulating frequency. The frequency of this, using the examples given, would be 40 Hz as may be ascertained by subtrating 410 from 500 and then subtracting 50 from that result. As will be apparent, as the frequency of the signal represented by 98 approached the frequency of any of the intermodulation products such as 96 or 94, the signal 108 will be detected by the system and will be superimposed upon the signal 106. The signal 108 will in such an instance completely mask any variability of signal 106 and cause the gain control circuit to lose control since the information being presented is no longer indicative of the operating point of the laser in hybrid 20. When the signal 108 becomes the same frequency as the signal 106, the signal 108 overrides the signal 106 and the control system has a large amplitude (uncontrolled) signal at lead 69 represented in FIG. 5 by waveform 110.

Figure 6:
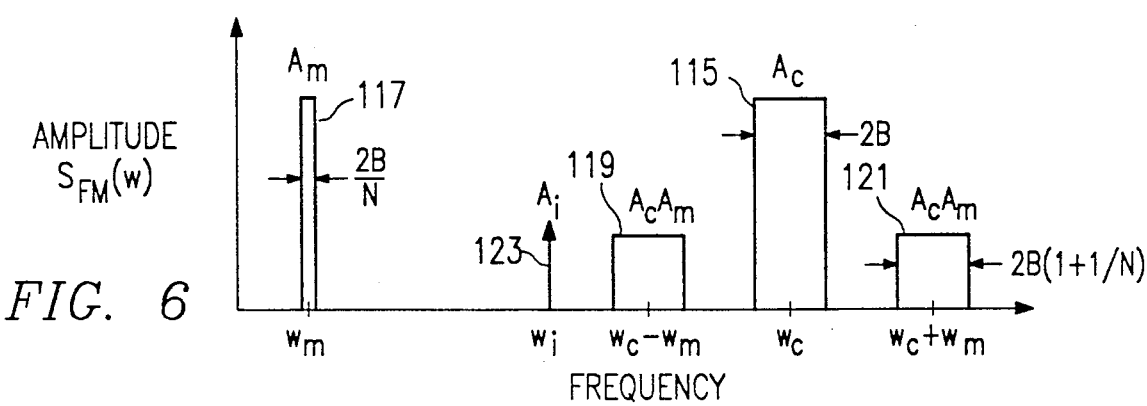
FIGS. 6 through 8 illustrate the frequency spectra of signals at various points in FIG. 1 when the present inventive concept is utilized.
Figure 9:
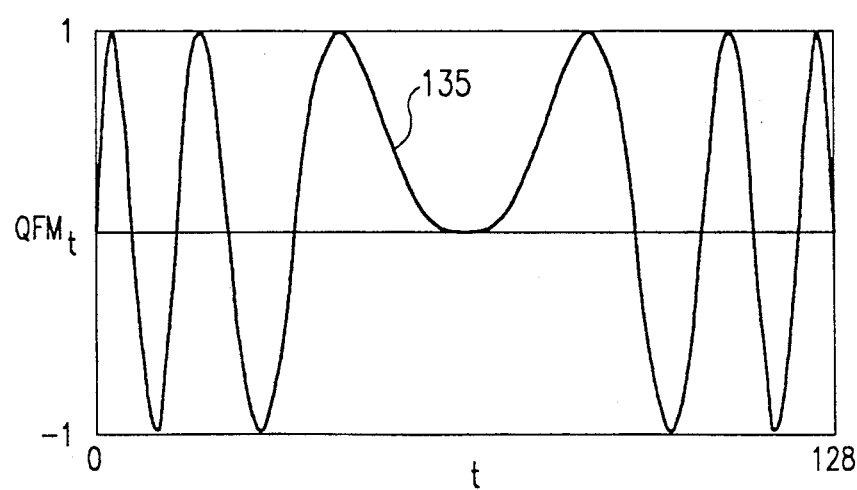
FIG. 9 illustrates the effect of an interfering tone on the circuit of FIG. 1 when the present inventive concept is utilized.

In FIG. 6, a band (2B) of frequencies 115 is illustrated representative of the 500 Hz oscillator 38 being modulated in frequency by oscillator 37 over a range of 490 to 510 Hz. A further band (2B/N) of frequencies 117 representative of the modulating frequency is 1/10th as wide as the band 115 as illustrated. (As presented, B is the frequency deviation and N is the dividing factor of block 44.) A pair of frequency bands 119 and 121 represent the sum and difference band products of the bands of frequencies 117 and 115. An interfering tone 123 is again used in the same manner as in FIG. 2. The frequency of the center of each of the bands from 115 to 121 will be assumed to be the same as previously used in FIG. 2 for convenience of discussion. A further band designated as 127 represents the band of frequencies left over after detection by envelope detector 72. The band of frequencies 119 is 2B (1+1/N) as is indicated for the block 121. When the detection process of the signals of FIG. 6 takes place, a resulting signal Ac, or otherwise labeled 129 in FIG. 7, removes a 2B bandwidth of signals from the bands of signals represented by 119 and 121 and leaves only the remainder illustrated as 127. However, a band of signals 125 is generated due to the interaction of the interfering tone 123 and the band of signals 115 of FIG. 6. The further synchronous detection process occurring in block 66 provides a dc signal component labeled as 131 and also as $A_cA_m$ and a band of signals 133 which again is an interfering tone range of signals similar to 108 of FIG. 4. Due to the sweeping action of oscillator 37, the effect of the interfering tone from the band of frequencies 133 will produce an interfering tone signal such as shown in FIG. 9 which shows that the interfering tone signal represented by 135 is changing in frequency until the maximum effect in the center of FIG. 9 where the interfering tone frequency is exactly the same frequency as the intermodulation product signal represented by block 127. Since the sweep continues, this intermodulation product frequency and the frequency of the interfering signal represented by 133 separates, and after the frequency of the interfering tone passes out of the bandwidth of the control system, there is no longer an adverse effect.

Most control systems, and in particular the one described by the present invention, have an integrating action and thus, momentary disturbances do not affect the control. Since the interfering effect has been reduced to no more than 10% of the time, there is not enough of a buildup time of the interfering signal to affect the control of the signal appearing on lead 36 to the attenuator 16.

OPERATION

The operation of the present invention will be substantially apparent from everything presented to this point. The circuitry of FIG. 1 is very similar to that in the referenced patent application. This is a circuit where it is desirable to have the data applied on lead 14 output on the optical fiber 22 at a reasonably constant amplitude. The amplitude of this signal is dependent upon the parameters of the laser within laser hybrid 20. Since laser's parameters vary with both age and temperature, a control system is normally provided to adjust both the biasing (average power output) and the maximum amplitude (gain of the circuit). The output from the laser is detected by a rear beam detector (RBD) and the signal representative thereof is supplied on RBD output 56. The average power control is accomplished by a direct detection of this output while the gain is obtained by detecting a derivative of the non-linearity of the laser and through an analysis and integration of the intermodulation products, the operational point on the diodes operational curve can be ascertained to be used to control the amplitude of the incoming signal and thus, control the amplitude of the output signal whereby the diode is not overstressed or overdriven and yet provides appropriate amplitude and distortion-free output signals which can be received by the apparatus at the other end of optical fiber 22.

As previously mentioned, when interfering tones, such as those generated in gallium arsenide based integrated circuits occur, the amplitude control feedback can be rendered inoperative. This occurs when the interfering tone has the same frequency as the intermodulation signals being detected. In such a situation, the continuous presence of the interfering signal will override the integration aspects of the control system and thus, the intended detection product (the derivative of non-linearity) can no longer be used to provide control until the interfering signal is removed.

As is obvious, if the spurious signal were to remain at a given frequency, the circuitry could be redesigned to use different intermodulation products at different frequencies and filters could be used to eliminate such interfering signals. However, where the spurious signals vary over a wide range of frequencies, such a prior art approach will not suffice. The present invention utilizes the sweep from oscillator 37 to provide a reasonably low frequency variation in the frequency of operation of oscillator 38 over a range of ±10 Hz so that in one embodiment of the invention the carrier signal 115 varies from 490 to 510 Hz while the modulating signal such as 117 varies from 49 to 51 Hz.

Figure 4:
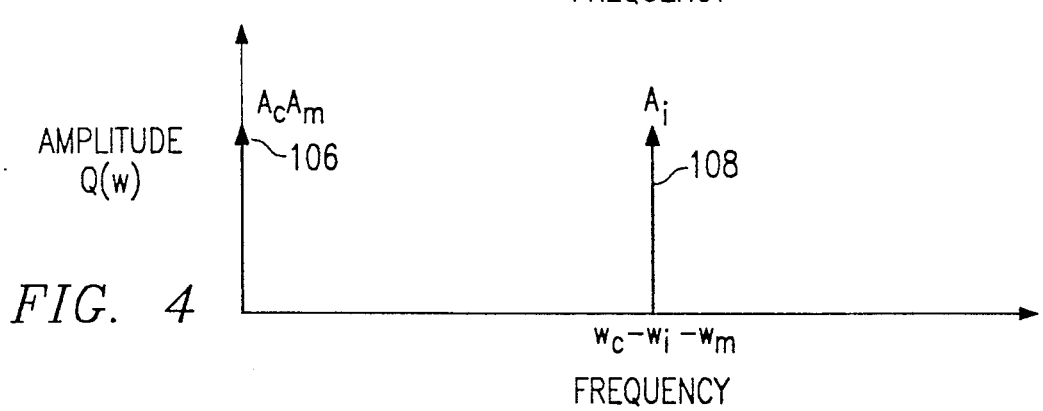
Figure 5:
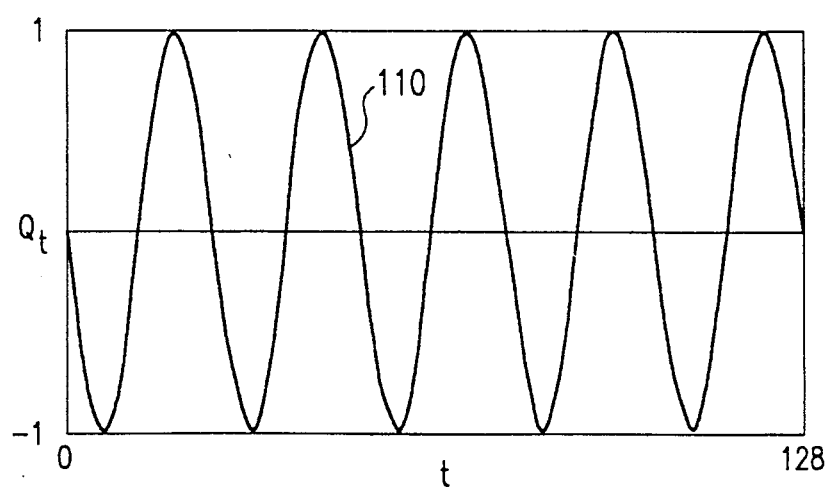
FIG. 5 illustrates an example of the effect of an interfering tone in the circuit of FIG. 1 without the present inventive concept.

When using the prior art approach, the oscillator 37 would not be in FIG. 1, and the frequency spectrum would be as shown in FIGS. 2 through 4. When the interfering frequency 98 became such that it would interact with other signals such as the carrier signal represented by 92, and produce a Wc-Wi signal 104 which is exactly the same frequency as the modulated signal 102, then at the output of detector 66, the resultant signal would be such as shown in FIG. 5 for as long as the interfering frequency remained at that frequency. With temperature variations, etc., the interfering frequency may drift off if it is caused by a gallium arsenide based integrated circuit, and the circuit may resume proper operation. However, such temporary interferences with the control system cannot be tolerated.

Figure 7:
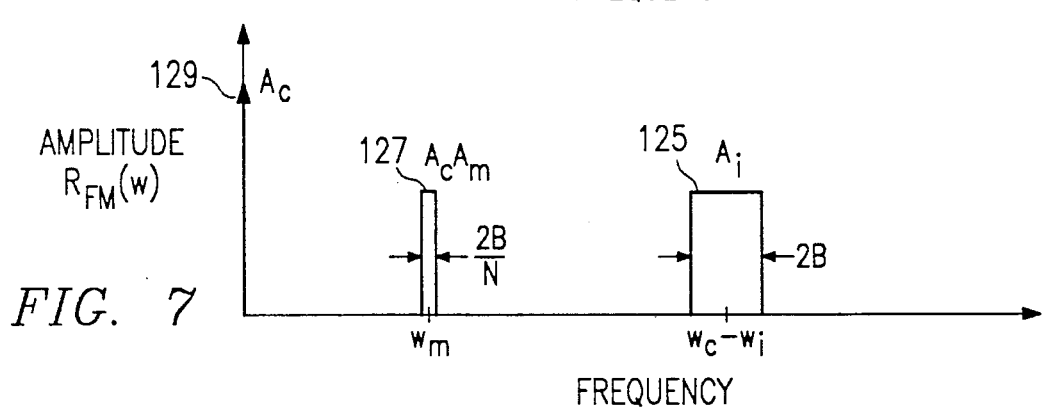
Figure 8:
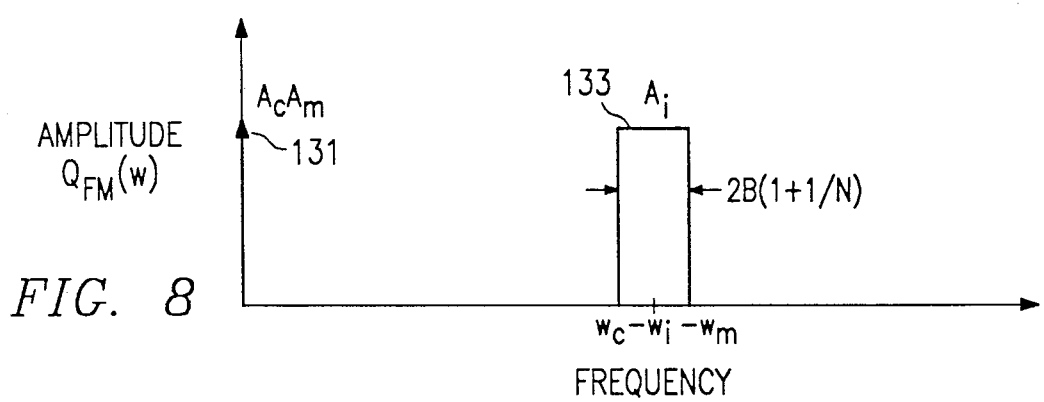

Thus, the oscillator 37 was inserted to continuously vary the specific frequency of operation of the control system signal generation and detection portion to produce the bands of signals as illustrated in FIGS. 6 through 8. Where the modulating and carrier signal frequencies are as assumed in the Detailed Description, and where the control system has a control bandwidth of one Hz, the fact that oscillator 37 causes oscillator 38 to sweep ±10 Hz, prevents any interference for 10/11ths of the sweep time. When the interfering tone approaches the detected signal such as on the lefthand portion of FIG. 9, the amount of interference with the normal control signal $A_cA_m$ is still very small. The interference does build, however, as the specific frequency of the interfering product signal represented by band 125 continues to approach the modulating signal represented by band 127. As the interfering frequency within band 133 continues to change due to the sweep action of oscillator 37, the effect will be less and less until it falls outside the one Hz bandwidth of the control system. Then, for the rest of the sweep, there will be no effect on the normal control signal. The integrating portion of the low-pass filter 68 will not be substantially affected by a false amplitude signal occurring for such a little portion of the total time and thus, the control system will continue to properly control the voltage attenuator 16 so that the output from the laser hybrid 20 will be the appropriate amplitude.

We have disclosed herein a specific approach to varying the control tone frequencies to minimize the effect of spurious tones such as generated in a gallium arsenide integrated circuit. However, the concept is believed to cover any instance where a circuit, having a non-linear element, uses a derivative of a control tone passed through that element to control parameters of the main signal path regardless of the source of spurious interfering signals.

We thus wish to be limited only by the scope of the claims wherein we claim:

1. A control system, having a given control bandwidth, used as part of a signal feedback mechanism, to control the amplitude of a primary signal flowing through a controlled circuit utilizing at least one non-linear element comprising, in combination:
   controlled circuit path means including non-linear element means and control circuitry, having a given control bandwidth, for detecting the operating point of the non-linear element utilizing control tone products, which control products are a function of a derivative of said non-linear element, generated as a control tone is passed through said non-linear element; and
   means for modulating the frequency of said control tone over a range of frequencies wider than the control bandwidth of the system.

2. Apparatus for sweeping a primary signal with respect to a spurious interfering signal comprising, in combination:
   reference oscillator first means for supplying at least one control tone signal to be used in a control system intermodulation algorithm;
   primary signal path second means, including non-linear element third means, connected to said first means for passing both said control tone and a primary signal through said non-linear element;
   signal detection fourth means, connected to said signal path second means, for detecting a product of the control tone, which is a function of a derivative of the non-linearity of said non-linear element third means, after passage thereof through said non-linear element third means;
   feedback fifth means, connected between said fourth means and said second means, for controlling at least one characteristic of said primary signal in accordance with the detected values of said control tone; and
   modulation means, connected to said first means, for modulating said control tone signal to minimize the effects of spurious frequency signals in said apparatus.

3. Control apparatus for providing feedback control of a circuit, which includes a non-linear element, as a function of the present operation parameters of the non-linear element comprising, in combination:
   controlled circuit means including primary signal input means, primary signal output means, control input means and a signal path between said primary signal input means and said primary signal output means;
   non-linear element first means comprising a part of said signal path of said controlled circuit means wherein signal parameters from signal input to signal output of said controlled circuit means must be controlled as a function of where, in a permissible range of a continuous non-linearity characteristics of said first means, said first means is operating;

primary signal supplying means, connected to said primary signal input means of said controlled circuit means for supplying a primary input signal thereto, a primary output signal of a given amplitude thereby resulting at said primary signal output means of said controlled circuit means;

signal injecting second means connected to said controlled circuit means for injecting a control tone into said signal path where the control tone is of a small enough amplitude as compared to the amplitude of said primary signal to cause minimal distortion of the primary signal of said controlled circuit;

detection third means, connected to said controlled circuit means, for detecting a control tone product indicative of the derivative of the non-linearity characteristic of said first means which product may be used for generating a feedback control output signal;

fourth means, connected between said third means and said control input means of said controlled circuit means, for applying said feedback control signal thereto in control of the amplitude of said primary output signal; and modulating fifth means, connected to said signal injecting second means and said detection third means, for modulating the frequency of the signal being injected and detected.

4. Control apparatus for providing feedback control of a primary signal passing through a circuit, which circuit includes a non-linear element, as a function of variable parameters of the non-linear element comprising, in combination:

controlled circuit means including a primary signal passing through a signal path between primary signal input means and primary signal output means, and further including feedback input means;

non-linear element first means comprising a part of said signal path of said controlled circuit means wherein the gain of said primary signal from signal input to signal output of said controlled circuit means must be controlled as a function of where, in a permissable range of a continuous non-linearity characteristics of said first means, said first means is operating;

signal injecting second means connected to said controlled circuit means for injecting a control tone into said signal path where the control tone is of an amplitude as compared to the amplitude of said primary signal to cause insignificant distortion of the primary signal of said controlled circuit;

detection third means, connected to said controlled circuit means, for detecting a control tone product indicative of the derivative of the non-linearity characteristic of said first means and for applying a feedback control output signal to said feedback input means of said controlled circuit means; and modulating fifth means, connected to said signal injecting second means and said detection third means, for modulating the frequency of the signal being injected and detected.

5. The method of minimizing the effect of spurious oscillation signals on detected control signals in a control system having a given control bandwidth and utilizing linked carrier and modulation signals, generated from a single reference signal, which are subsequently used to produce intermodulation products and resultant detected control signals comprising the steps of:

generating a single reference signal to be used to produce intermodulation products and resultant control signals in a feedback control loop; and modulating the frequency of the single reference signal over a range wider than the control bandwidth of the system to minimize the time that the spurious signals and the resultant control signals are at the same frequency.

* * * * *